United States Patent
Joshua et al.

(10) Patent No.: US 12,506,480 B2
(45) Date of Patent: Dec. 23, 2025

(54) MINI-PUMP LEVEL SHIFTER FOR ROBUST SWITCHING OPERATION UNDER LOW VDD ENVIRONMENT

(71) Applicant: SanDisk Technologies, Inc., Milpitas, CA (US)

(72) Inventors: Alvin Joshua, Fujisawa (JP); Hardwell Chibvongodze, Hiratsuka (JP); Yuki Kuniyoshi, Fujisawa (JP); Akitomo Nakayama, Yokohama (JP)

(73) Assignee: Sandisk Technologies, Inc., Milpitas, CA (US)

( * ) Notice: Subject to any disclaimer, the term of this patent is extended or adjusted under 35 U.S.C. 154(b) by 8 days.

(21) Appl. No.: 18/346,344

(22) Filed: Jul. 3, 2023

(65) Prior Publication Data

US 2024/0364338 A1 Oct. 31, 2024

Related U.S. Application Data

(60) Provisional application No. 63/498,262, filed on Apr. 25, 2023.

(51) Int. Cl.
  *H03K 19/0185* (2006.01)
  *H03K 3/356* (2006.01)

(52) U.S. Cl.
  CPC ........... *H03K 19/018521* (2013.01); *H03K 3/356113* (2013.01)

(58) Field of Classification Search
  CPC ..... H03K 19/018521; H03K 3/356113; H03K 19/018528; H03K 19/018557; H03K 19/018564; H03K 19/018578; H03K 19/094; H03K 19/09403; H03K 19/0941; H03K 19/0944; H03K 19/0948; H03K 19/0175; H03K 19/017509; H03K 19/0185; H03K 19/018514; H03K 19/018507; G06F 3/00
  See application file for complete search history.

(56) References Cited

U.S. PATENT DOCUMENTS

| | | | |
|---|---|---|---|
| 7,795,946 B2 | 9/2010 | Kim | |
| 8,686,784 B2 | 4/2014 | Wang | |
| 9,391,600 B2 | 7/2016 | Lau | |
| 10,305,482 B2 * | 5/2019 | Chen | H02M 3/155 |
| 10,505,543 B2 | 12/2019 | Reinhold et al. | |
| 11,206,023 B1 | 12/2021 | Bogi et al. | |
| 2007/0188194 A1 * | 8/2007 | Yang | H03K 19/018528 |
| | | | 326/80 |

* cited by examiner

*Primary Examiner* — Jung Kim
(74) *Attorney, Agent, or Firm* — Pearl Cohen Zedek Latzer Baratz LLP

(57) ABSTRACT

On memory die and other circuits, some parts may operate at a VDD logic level while other elements operate at a higher logic level, such as at or near the die's supply level VSUP. To reduce power consumption and increase operating speeds, VDD levels are moving to increasingly lower voltages. To raise the logic signal from the lower level to the higher, level shifters can be used. However, as the gap between the supply level VSUP and VDD widens, it can become difficult for a level shifter to reliably raise a logic signal operating at the VDD level to the VSUP level. The address this problem, the following introduces a small charge pump to boost the input logic signals for level shifter circuits to allow them to reliably generate an output logic signal at the VSUP level from an input logic signal at low VDD levels.

15 Claims, 17 Drawing Sheets

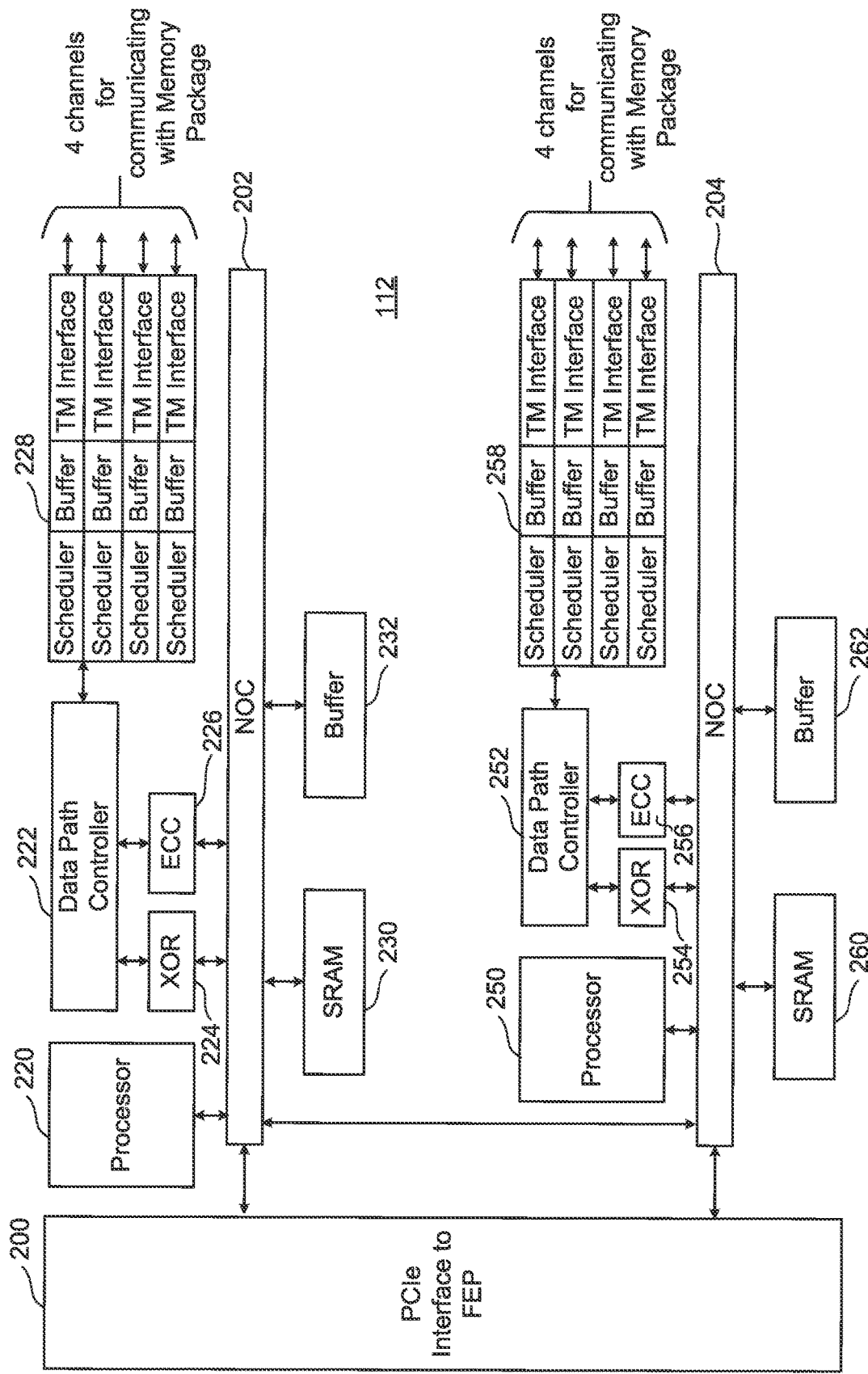

MINI-PUMP LEVEL SHIFTER FOR ROBUST SWITCHING OPERATION UNDER LOW VDD ENVIRONMENT

CLAIM OF PRIORITY

The present application claims priority from U.S. Provisional Patent Application No. 63/498,262, entitled "MINI-PUMP LEVEL SHIFTER FOR ROBUST SWITCHING OPERATION UNDER LOW VDD ENVIRONMENT," by Joshua et al., filed Apr. 25, 2023, incorporated by reference herein in its entirety.

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed, but also to use lower power.

BRIEF DESCRIPTION OF THE DRAWINGS

Like-numbered elements refer to common components in the different figures.

FIG. 2A is a block diagram of one embodiment of a Back End Processor Circuit.

DETAILED DESCRIPTION

In many devices, such as a memory die, different parts of the circuitry operate at different logic levels. For example, the state machine and other system control logic of a memory die may operate at a VDD logic level while other elements, such as decoding circuitry for the memory array, may operate at a higher logic level, such as at or near the die's supply level VSUP. To reduce power consumption and increase operating speeds, VDD levels are moving to increasingly lower voltages. To raise the logic signal from the lower level to the higher, level shifters can be used. However, as the gap between the supply level VSUP and VDD widens, it can become difficult for a level shifter to reliably raise a logic signal operating at the VDD level to the VSUP level. The address this problem, the following introduces a small charge pump to boost the input logic signals for level shifter circuits to allow them to reliably generate an output logic signal at the VSUP level from an input logic signal at low VDD levels.

FIGS. 1A-6 describe one example of a storage system that can be used to implement the technology disclosed herein.

Figure 1A:
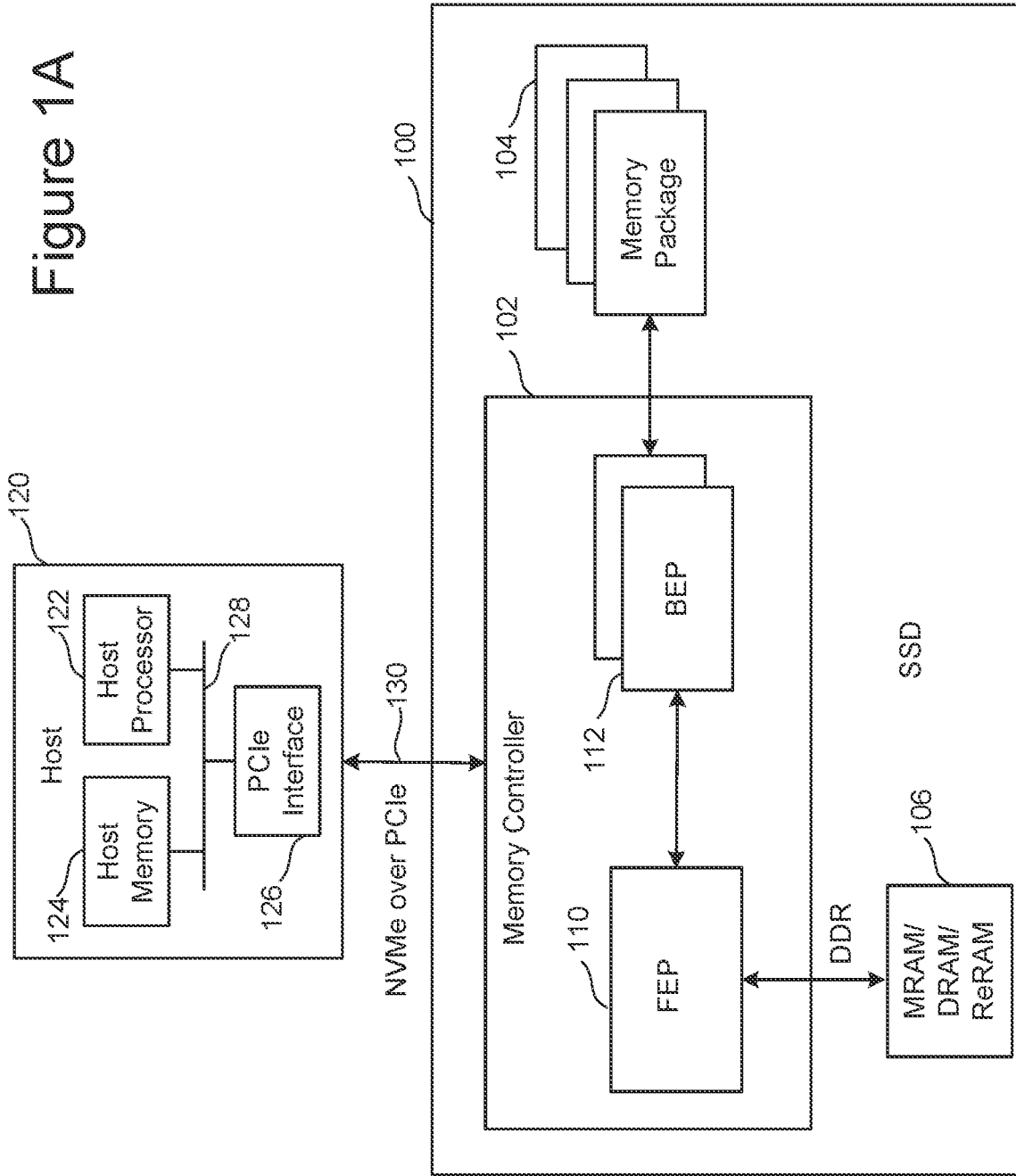
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master, and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include a Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host system 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
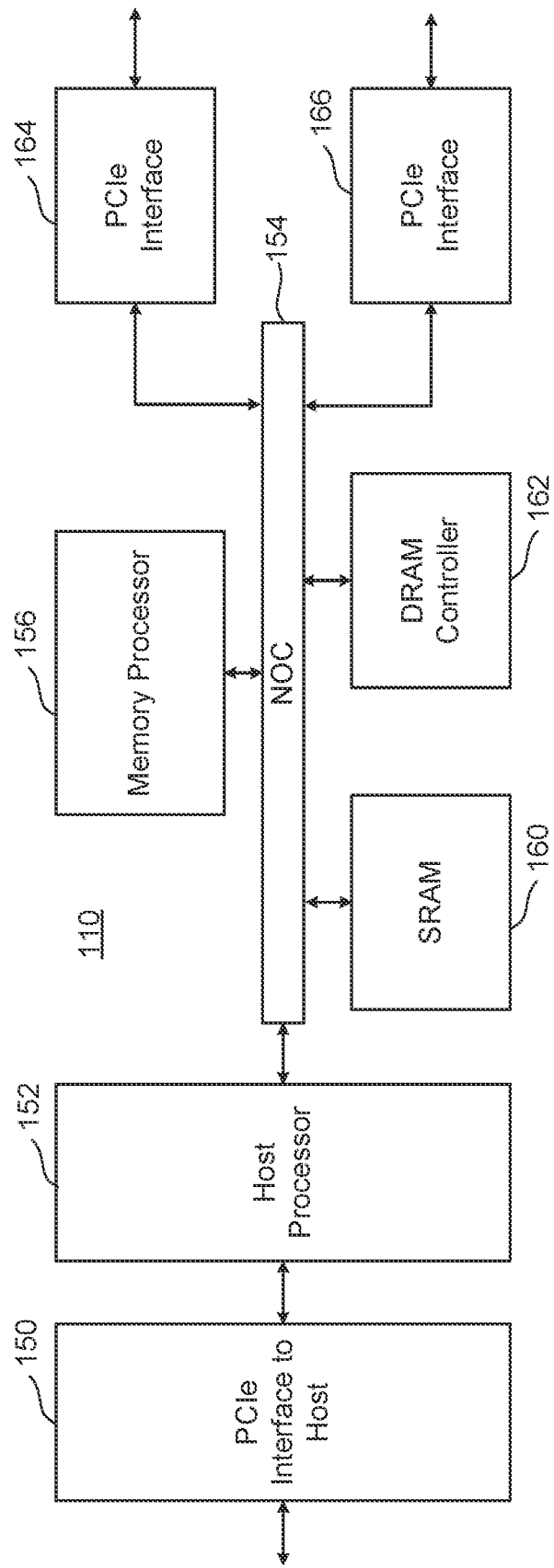
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
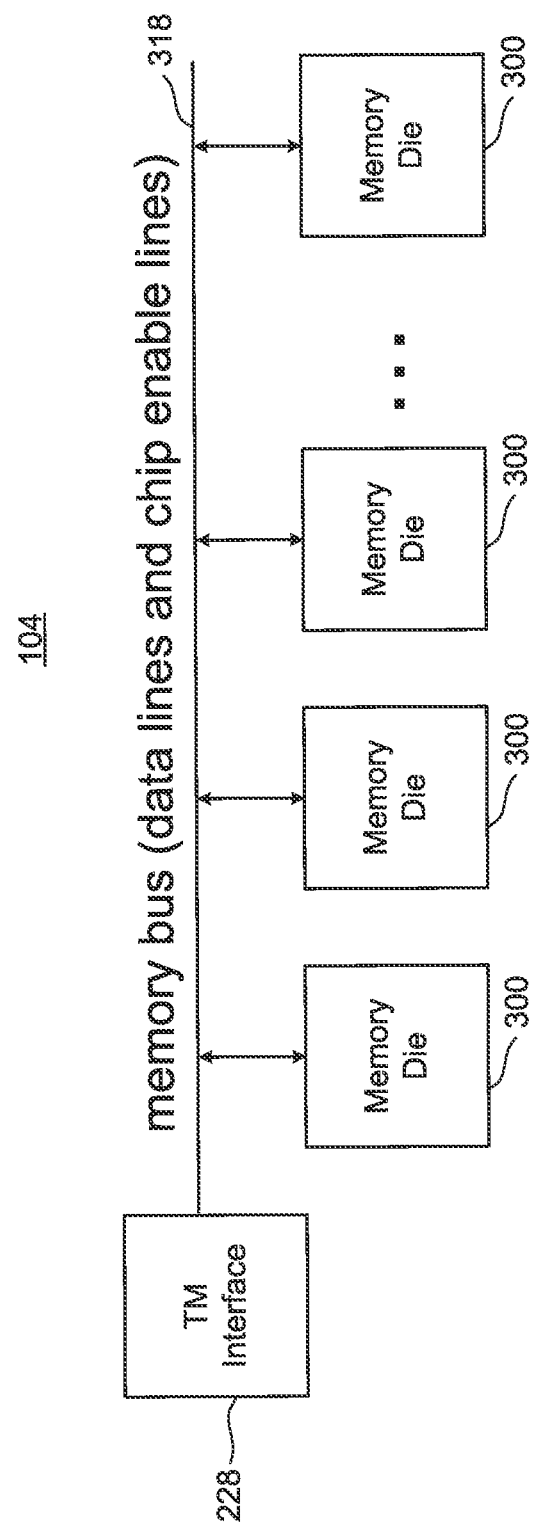
FIG. 2B is a block diagram of one embodiment of a memory package.

FIG. 2B is a block diagram of one embodiment of a memory package 104 that includes a plurality of memory dies 300 connected to a bus (data lines and chip enable lines) 318. The data bus 318 (memory bus) connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
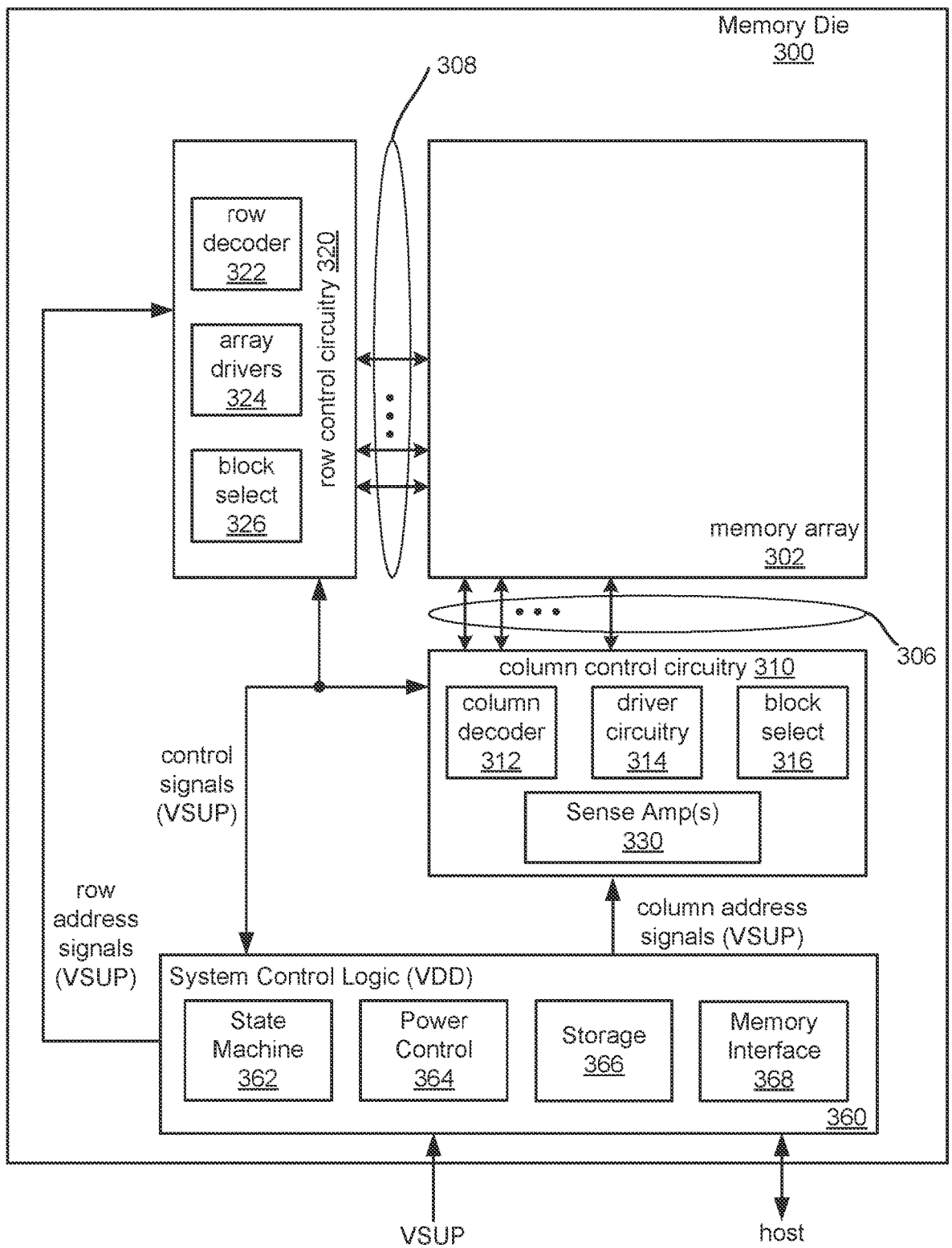
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs are connected to respective word lines of the memory array 302 via electrical paths 308. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs are connected to respective bit lines of the memory array 302. Although only single block is shown for memory structure 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. System control logic 360 includes storage 366, which may be used to store parameters for operating the memory array 302.

One input to the memory die 300 or controller die 311 is a supply voltage VSUP, which is represented separately as it will be discussed below. The power control module 364 can then generate the various voltage levels used on the die. The system control logic 360, for example, will operate at a high logic level VDD, as noted parenthetically in system control logic 360. To reduce power consumption, the VDD voltage level will often be quite a lower than the received supply voltage level VSUP, being stepped down to a regulated level by a voltage regulator in the power control module 364. As technology progresses, the voltage level used for VDD continues to decrease. The column control 310 and row control circuitry 320 will often operate at a high voltage level than VDD, such as VSUP as indicated parenthetically for the control and address signals between these elements and the system control logic 360. (Although the control and address signals are here shown as operating at VSUP to simplify the discussion, more generally this can be another level than the VSUP received by the memory die 300 or controller die 311, although still higher VDD.) Consequently, to raise these control and address signals from VDD to the higher level, the power control module 364 or other element in the system control logic can use a level shifter, as is discussed more detail below.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "control circuit(s)" can include a controller, a state machine, a micro-controller, micro-processor, and/or other control circuitry as represented by the system control logic 360, column control circuitry 310 or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits and latches within the available area can be a significant restriction on sense amplifier and latch design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders, latches, and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
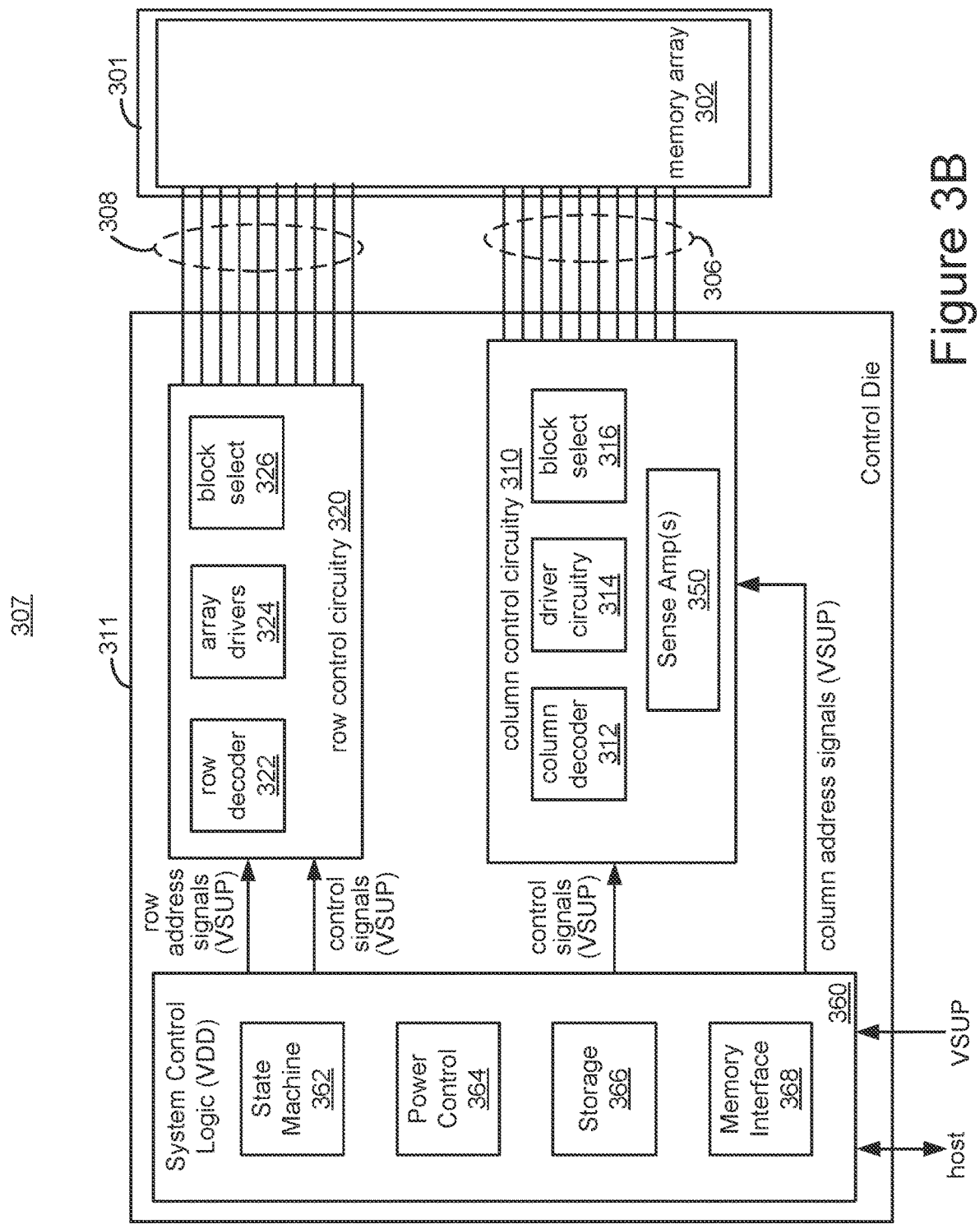
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver 314, and block select circuitry 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select circuitry 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "control circuit(s)" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

As discussed above with respect to FIGS. 3A and 3B, the system control logic 360 will often operate at one value for the high logic level of VDD, while the column control circuitry 310 and row control circuitry 320 will operate at a different, higher voltage logic level, referred to in the following discussion as VSUP, which may be the same or different than the supply level received by the memory die 300 or controller die 311. To raise the high logic level from VDD to VSUP, a level shifter circuit can be used.

Figure 4:
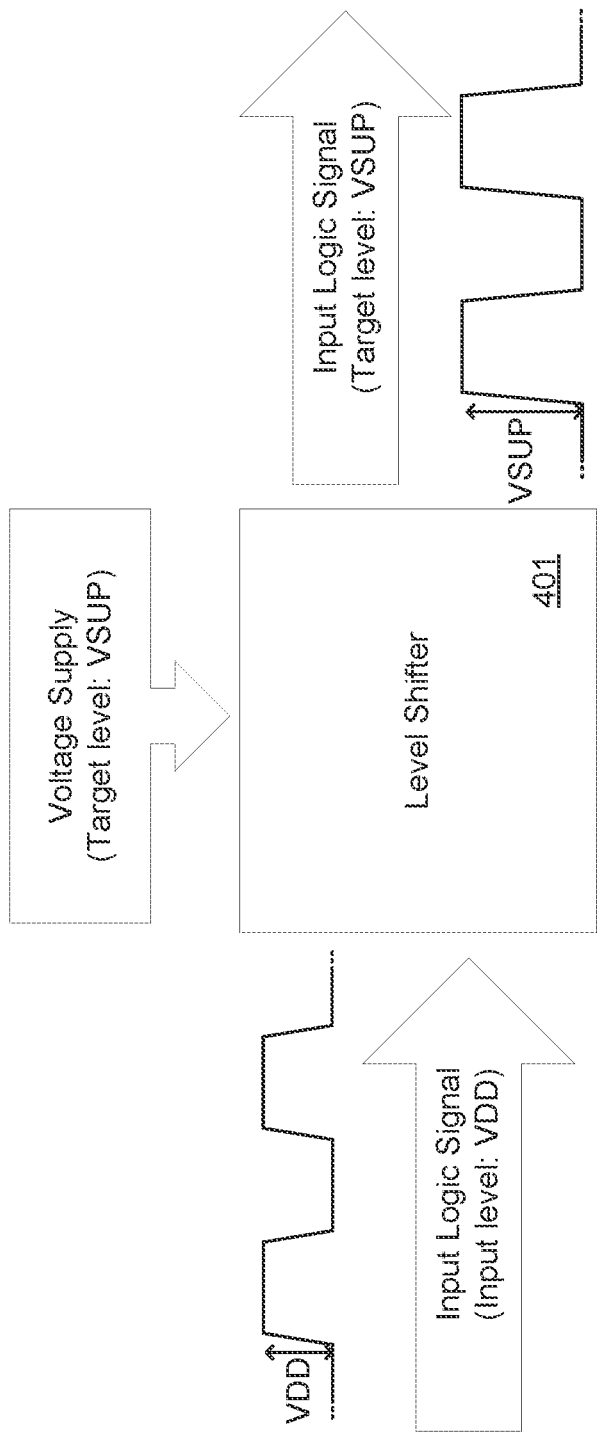
FIG. 4 is a schematic representation of a level shifter's function.

FIG. 4 is a schematic representation of an example of a level shifter's function. In this example, the level shifter 401 is connected to receive the voltage supply level of VSUP as received by the memory die 300 or control die 311, which is used shift the range of the input logic signal. Here the input logic signal has a high level of VDD, which is the level used by the system control logic 360 and for input/output signals to memory controller 102. The target level for the logic signals at the output is here VSUP as used as the high logic input level by elements of the memory die 300 or control die 311 such as charge pumps, the row control circuitry 320, and column control circuitry 310. An example input logic signal of alternating high and low values of amplitude VDD and the result shifted signal of amplitude VSUP are shown. Although the target logic level at the output of the level shifter 401 is the same as the voltage supply level of VSUP, other embodiments may use a value below VSUP but still above VDD.

Figure 5:
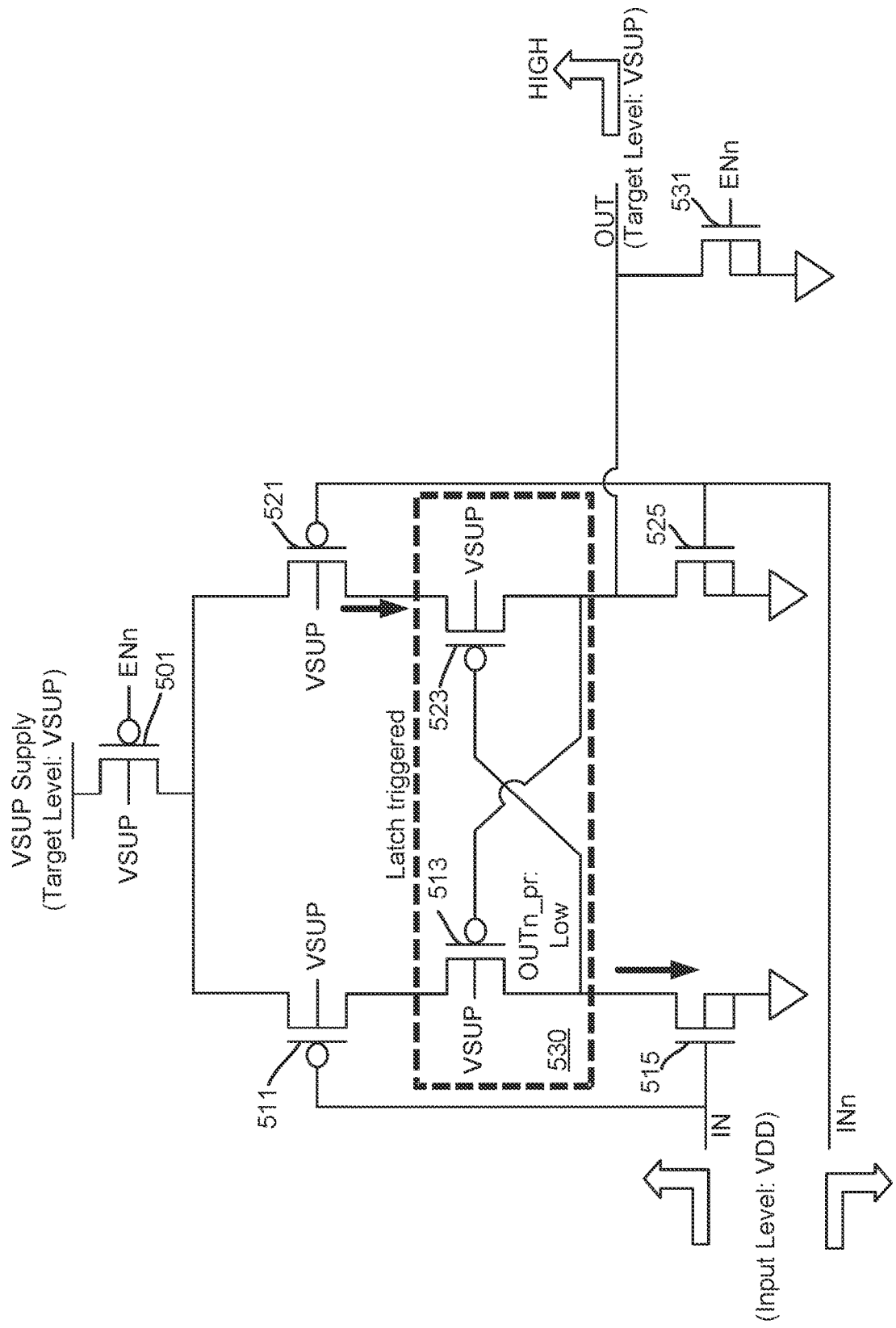
FIG. 5 illustrates an embodiment of level shifter circuit block and its expected operation.

FIG. 5 illustrates an embodiment of a level shifter circuit block and its expected operation. As arranged in FIG. 5, the level shifter receives the supply voltage level of VSUP at top, the input signal IN and its inverse INn are received from the left, and the generated output signal OUT is provided at right. The level shifter is connected to the supply level through a PMOS 501 connected to receive the inverse of a level shifter enable signal (ENn) at its control gate, and the output is connected to ground by an NMOS 531 also connected to receive ENn. When the level shifter is disabled, ENn is high, so that 531 is on and the output OUT is low and 501 is off and the level shifter is cutoff from the voltage supply. When the level shifter is enabled, ENn is low so that 531 is off and 501 is on. The following will consider the situation when the level shifter is enabled and some of the subsequent figures will omit the NMOS 531 and the PMOS 501.

The level shifter of FIG. 5 includes a left leg of a PMOS 511 and NMOS 515 connected in series, in that order, in series between the supply level and ground and both having their control gates both connected to receive the input signal IN that has a high level of VDD. Consequently, when IN is low PMOS 511 is expected to be on and NMOS 515 is expected to be off; and when IN is high PMOS 511 is expected to be off and NMOS 515 is expected to be on. The right leg of the level shifter of FIG. 5 includes a PMOS 521 and NMOS 525 connected in series, in that order, in series between the supply level and ground and both having their control gates both connected to receive the inverse of the input signal INn. Consequently, when IN is low, INn is high and PMOS 511 is expected to be on and NMOS 515 is expected to be off; and when IN is high, INn is low and PMOS 511 is expected to be off and NMOS 515 is expected to be on.

To improve the robust logical operation of the level shifter, a latch structure 530 is connected between the upper PMOS and lower NMOS of each leg of the level shifter. In the left leg, PMOS 513 is connected in series with and between PMOS 511 and NMOS 515; and in the right leg PMOS 523 is connected in series with and between PMOS 521 and NMOS 525. The transistors of latch 530 are cross-coupled, with the gate of PMOS 513 connected between PMOS 523 and NMOS 525 and the gate of PMOS 523 connected between PMOS 513 and NMOS 515. The output OUT is then taken from a node between PMOS 523 and NMOS 525.

FIG. 5 considers the situation when IN changes from a low value (VSS or ground) to a high value (VDD). Considering from when IN is initially low, INn is high, so that PMOS 521 is off and NMOS 525 is on, so that the gate of latch PMOS 513 is set to ground and on. As IN is low, PMOS 511 is on, NMOS 515 is off, and the gate voltage OUTn-pr of latch PMOS 523 is set to high. Consequently, when IN is low, the OUT value will be a low value set in latch 530.

When IN subsequently goes high, PMOS 511 shuts off, NMOS 515 turns on to drain current as illustrated by the arrow, and the voltage OUTn_pr on the gate of PMOS 523 is pulled low and 523 turns on. As INn goes low, PMOS 521 turns on and conducts as illustrated by the arrow, NMOS 525 is off, and the gate on PMOS 513 is high. Consequently, the latch 530 is triggered and the voltage on the output OUT will go to VSUP.

For both power reduction and faster operating speeds, the trend has been toward lower VDD logic levels. This can result in a VSUP voltage level that is relatively high compared to VDD. As described with respect to FIG. 5, for the level shifter to function properly when IN is at its high level of VDD, PMOS 511 needs to be off. However, if the difference (VSUP−VDD) is too large, a large current may still flow through PMOS 511 even when IN is high and the latch 530 may fail to flip. This can be illustrated with respect to FIG. 6.

Figure 6:
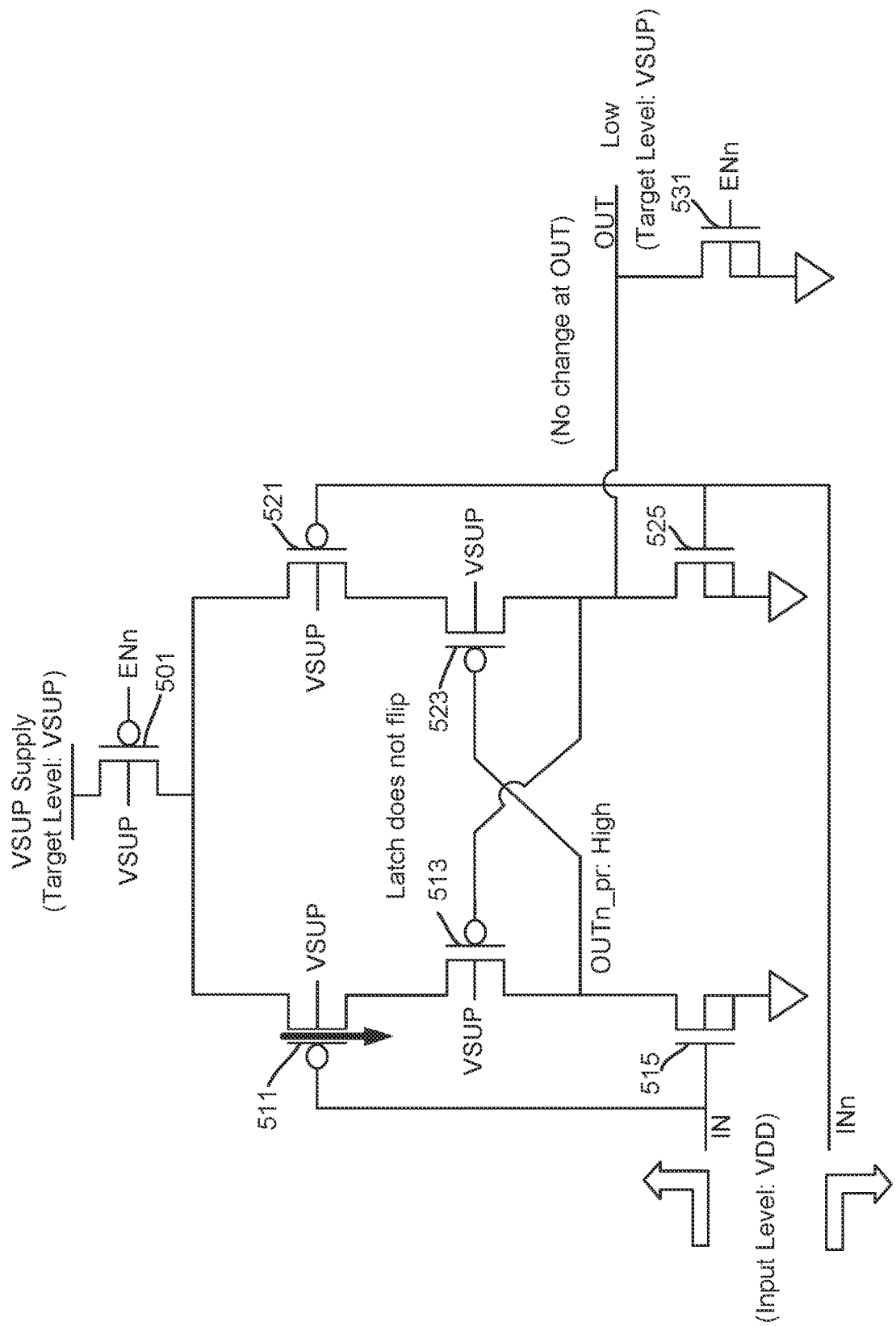
FIG. 6 illustrates the situation when the level shifter circuit block of FIG. 5 is operated with too low an input level relative to its supply level.

FIG. 6 illustrates the situation when the level shifter circuit block of FIG. 5 is operated with too low a relative input level. FIG. 6 repeats the elements of FIG. 5 (although the latch structure 530 of cross-coupled PMOSs 513, 523 is not boxed and numbered), but is marked for the situation when (VSUP−VDD) is large with respect to the Vth of the transistors. Considering when IN switches from low (VSS) to high (VDD), although VDD is still applied to the gate of PMOS 511 a larger current will continue to flow through PMOS 511, as illustrated by the large arrow. As OUT is still low, PMOS 513 will still be on and NMOS 515 will not be sufficiently be ON to take the node OUTn_pr between PMOS 513 and NMOS 515 low, so that OUTn_pr is high and the latch 513, 523 does not flip. Consequently, OUT stays low. One way to address this is to use larger area transistors, but this would require a large NMOS vs PMOS area multiplier, consuming significantly more of the valuable surface area of the die. To address this situation without resorting to such large transistors, the following presents embodiments for a level shifter employing a small charge pump, or mini-pump, to boost the input signals to the level shifter.

Figure 7:
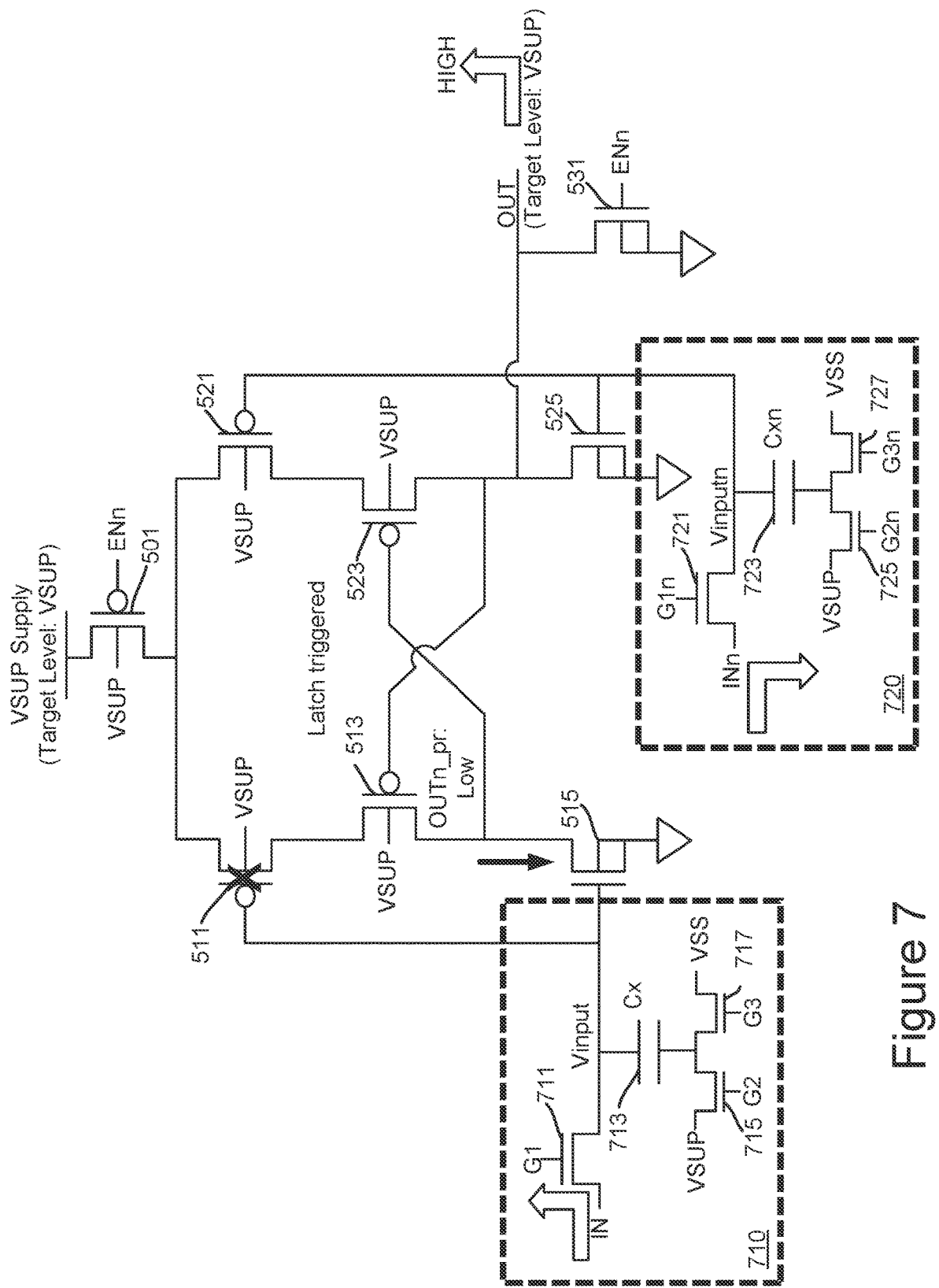
FIGS. 7 and 8 present a first embodiment of a mini-pump level shifter circuit and a corresponding set of control signals.
Figure 8:
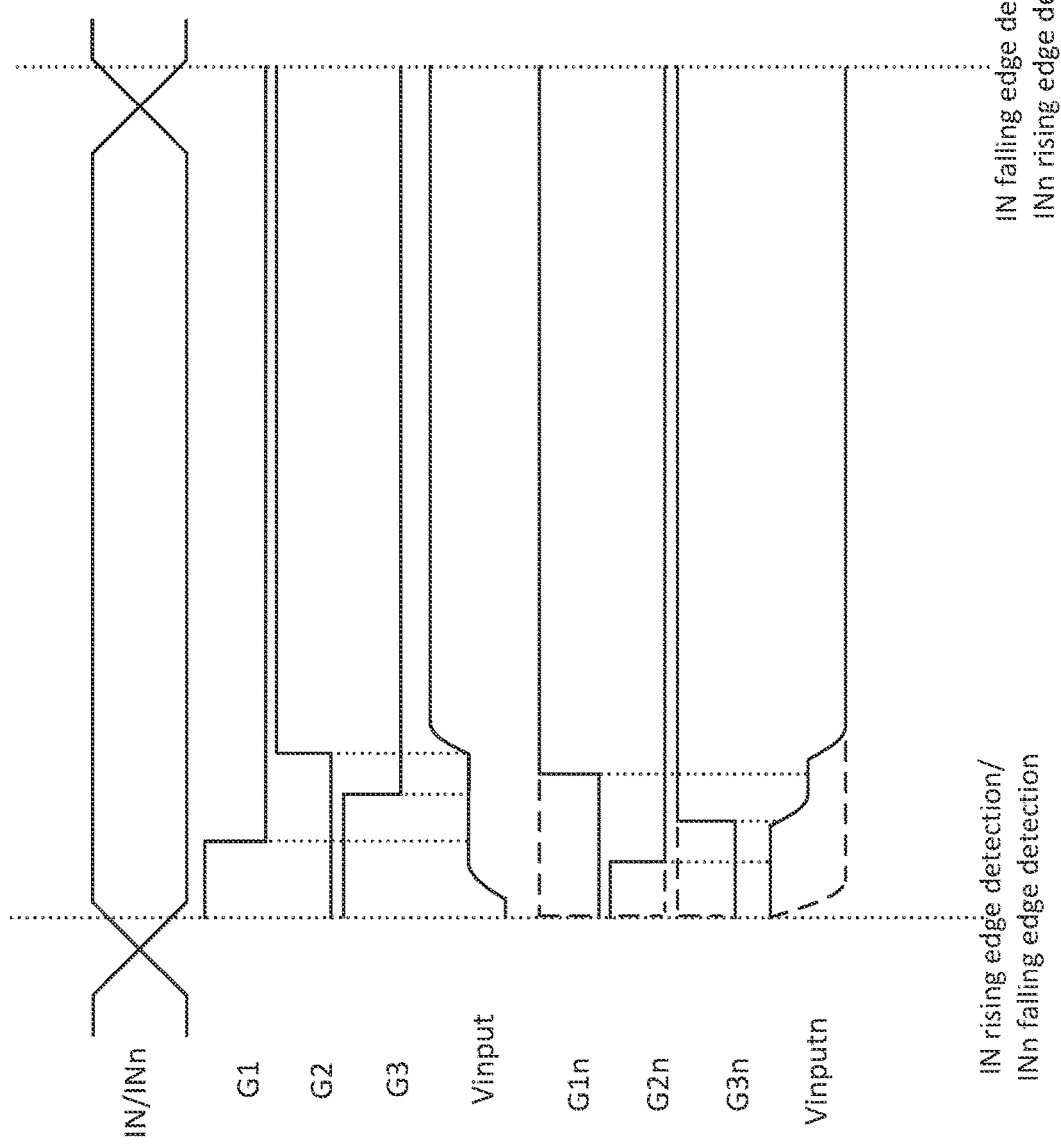

FIGS. 7 and 8 presents a first embodiment of a mini-pump level shifter circuit and a corresponding set of control signals. FIG. 7 repeats the elements of FIGS. 5 and 6, but now the input signal IN is supplied through a mini-pump 710 and the inverse input signal INn is provided by way of a mini-pump 720. Although more generally applicable, the level shifter circuit of this and the following embodiments can be can be part of the power control block 364 of the system control logic 360 of FIGS. 3A and 3B, which can also be the control circuitry to generate the set of control signals of FIG. 8. FIG. 8 does not include the enable signal EN or, as supplied to the PMOS 501 and NMOS 531, its inverse 531, but these can also be provided by the control circuitry of the power control block 364, where the following discussions will be for the situation when the level shifter is enabled.

In the embodiment of FIG. 7, the charge pump 710 is a single stage Dickson type charge pump which generates a Vinput from the IN signal, but other embodiments could use additional stages or other charge pump designed if needed to generate a sufficiently high Vinput. The IN signal is connected to the Vinput node through an NMOS G1 711, where an upper plate of a pump capacitor Cx 713 is also connected to the Vinput node. (The plates of Cx 713 and other capacitors discussed herein will often be referred to as upper or top and lower or bottom plates based on their representations in the figures, but it will be understood that they may not be physically arranged that way on a die so that, more generally, these are just a capacitor's first and second plates.) The bottom plate of Cx 713 is connected to VSUP through NMOS G2 715 and to VSS through NMOS G3 717. The mini-pump 710 can boost the IN from VDD to Vinput=VDD+Vinjected, where Vinjected=VSUP×[$C_x/(C_x+C_n+C_p)$] and $C_x$, $C_n$, and $C_p$ are respectively the capacitances of Cx 713, NMOS 515, and PMOS 511. The control signal to generate Vinput from are illustrated on the top half of FIG. 8.

At the top, FIG. 8 illustrates the IN signal transition from low to high and back, with the INn signal consequently going from high to low and back. Underneath are a set of control signal for G1 711, G2, 715, and G3 717. As IN rises from VSS to VDD, at the rising edge detection, G1 is high so that VDD is passed to the Vinput node. G2 is low and G3 is high, so that the lower plate of Cx 713 is at VSS and the upper plate of Cx 713 will be set to VDD. G1 then goes low, trapping the charge transferred through G1 711 on the top plate of Cx 713. G3 then goes low, followed by G2 going high, transferring VSUP to the lower plate of Cx 713 and raising the upper plate of Cx 713 and Vinput to VDD+Vinjected. The resultant Vinput is shown below G3. Initially, Vinput ramps up to VDD as IN is transferred through G1 711 and then, when G2 715 turns on, is boosted by Vinjected to Vinput=VDD+Vinjected. This value of Vinput is applied to the control gates of PMOS 511 and NMOS 515, effectively turning PMOS 511 off and NMOS 515 on.

For the INn signal applied on the right-hand side, a mini-pump 720 is similarly formed to charge pump 710 to generate Vinputn from INn. INn is connected to the Vinputn node through G1n 721 and the capacitor Cxn 723 is connected between Vinputn and a node connected to VSUP through G2n 725 and VSS though g3n 727. As IN goes high and INn goes low, referring to the solid control signal lines, G1n and G3n are high and G2n is high, so that Vinputn is still at VDD+Vinjected. G2n then goes low followed by G3n going high, so that the lower plate of Cxn 723 drops from VSUP to VSS and Vinputn drops to VDD. G1n can then go high, pulling Vinputn to VSS. Once Vinputn is to ground, PMOS 521 is effectively on and NMOS 525 is effectively off. Consequently, the boosting of IN and INn to Vinput and Vinputn resulting the level shifter operating in the desired manner as described above with respect to FIG. 5.

The G1n, G2n, G3n, and resultant Vinputn waveforms also include a dashed waveform in their initial portions. These represent an alternate fast reset option in which G1n and G3n both go high, and G2n goes low at IN rising edge/INn falling edge detection. This pulls Vinputn low sooner, which provides similar functionality to the solid lines waveforms.

The discussion of FIGS. 7 and 8 illustrates the case when IN goes from low to high. When IN goes from the high VDD level to the low level, the process will be similar, but with the roles of IN, the mini-pump 710, and the elements shown on the left leg of the level shifter reversed with INn, the mini-pump 720, and the elements shown on the right leg of the level shifter.

Figure 9:
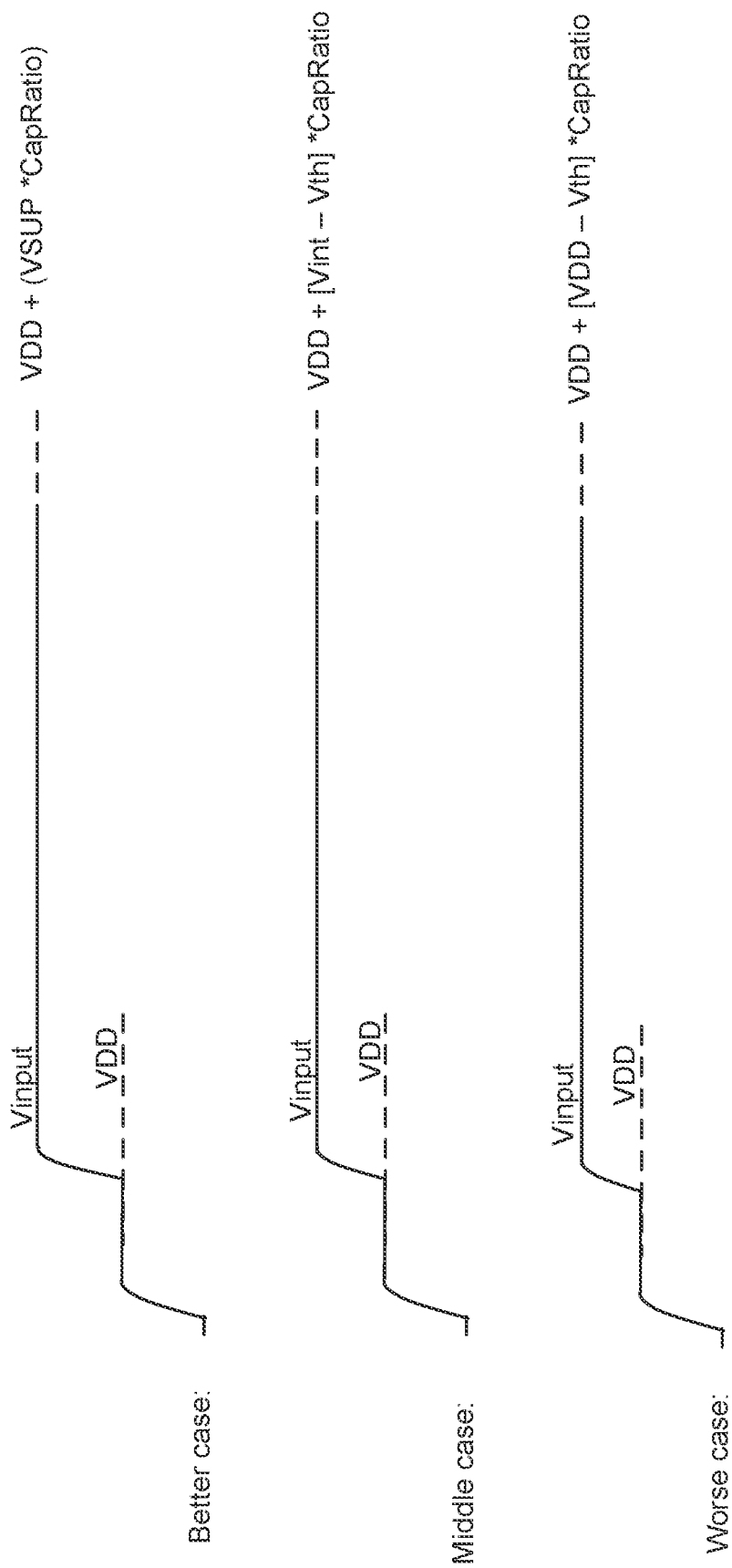
FIG. 9 considers the Vinput waveform of FIG. 8 in more detail for different amplitudes of the control signals used on the charge pump gates.

FIG. 9 considers the Vinput waveform of FIG. 8 in more detail for different amplitudes of the control signals used on the charge pump gates. The above discussion of FIGS. 7 and 8 has given that Vinput=VDD+VSUP*CapRatio, where CapRatio=[$C_x/(C_x+C_n+C_p)$]. This has implicitly assumed that a high logic level used for the control signal G1, G2, G3, G1n, G2n, and G3n, and particularly G2 and G2n, such that it is high enough that the transistors are fully turned on and that VSUP is fully passed to the lower plate of the capacitors Cx 713 and Cxn 723. The resultant Vinput waveform is illustrated as the better case at the top of FIG. 9. Although this provides better performance, the routing of such a relatively high logic level may not be readily implemented. If the high level of the control signal G2 is significantly lower than VSUP, then G2 715 will only pass G2-Vth, where here Vth is threshold voltage of G2 715.

The easiest implementation of the control signals G1, G2, G3, G1n, G2n, and G3n is to use the VDD logic level. This is a worse case and the result Vinput=VDD+[VDD−Vth] *CapRatio. If the logic level of the control signals G1, G1n is also low (such as VDD), then G1 711 will only pass G1−Vth1 for the threshold valueVth1 of G1 711, so that shown VDD will also be reduced, although G1 711 can be implemented as a low threshold device to reduce this effect. This implementation will be sufficient for many embodiments, but to accommodate lower VDD values, a middle case can use logic level for G2, G2n gates that is above VDD, but still less than VSUP. Such an intermediate high logic level Vint can be used to generate a middle case Vinput=VDD+[Vint−Vth]*CapRatio. A number of such Vint levels are often available on the memory die 300 or control die 311 for uses such as block decoding, for example.

Figure 10:
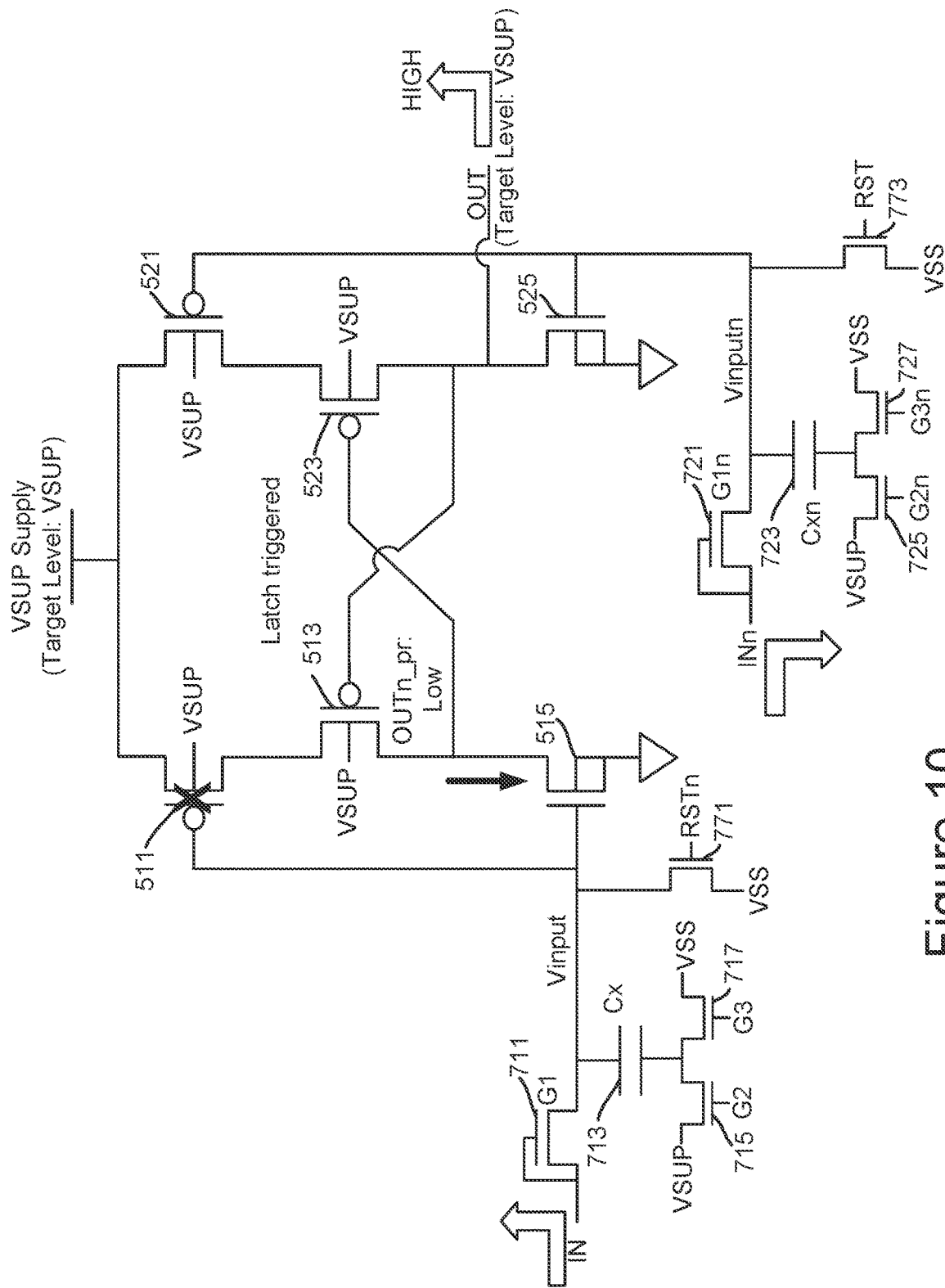
FIGS. 10 and 11 present an alternate embodiment of a mini-pump level shifter circuit and the boosted input from the charge pump.
Figure 11:
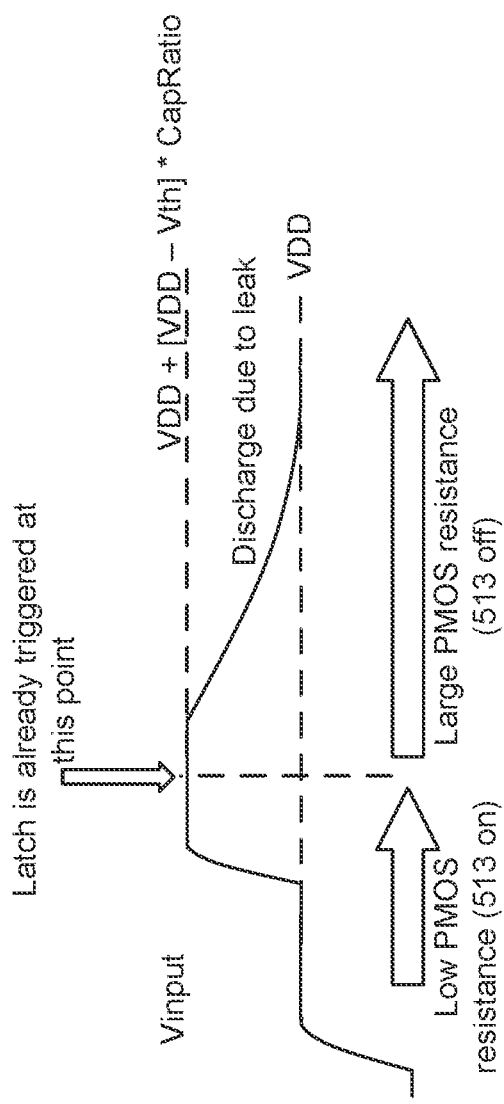

FIGS. 10 and 11 presents an alternate embodiment of a mini-pump level shifter circuit and the boosted input from the charge pump. FIG. 10 repeats the elements of FIG. 7, although PMOS 501 and NMOS 531 connected to receive the ENn signal are not shown to simplify the drawing. Additionally, the boxes around the charge pumps 710, 720 are also deleted to simplify the presentation. The changes in level shifter of FIG. 10 relative to FIG. 7 are the connections of the control gates of the NMOSs G1 711 and G1n 721 and the introduction of reset switches on the Vinput and Vinputn nodes.

Rather than use a control signal G1, G1n for the transistor G1 711, G1n 721, in FIG. 10 these two transistors are diode connected with their control gates connected to IN, INn to address possible charge leakage. To reduce losses across G1 711 and G1n 721, embodiments can use low Vth devices. The diode connection for G1 711 and G1n 721 can help to provide proper operation when Cx 713 and Cxn 723 have leakage and also reduce the need for the corresponding G1 and G1n control signals. The signal pairs G2, G2n and G3, G3n can be as described with respect to FIG. 8. To be able to reset Vinput and Vinputn to ground when these levels should be low, the corresponding NMOS reset switches RSTn 771 and RST 773 are added to alternately connect these nodes to VSS at the correct times.

FIG. 11 illustrates the resultant Vinput waveform for the embodiment of FIG. 10 in the presence of leakage when IN goes high. The IN, G2, and G3 waveforms can all be as in FIG. 8 and the RST signal high so that NMOS 771 is off. When the IN rising edge is detected, diode connected G1 711 will pass VDD to Vinput. If the threshold voltage Vth1 of G1 711 is accounted for, this is more accurately VDD−Vth1, but a low threshold device can be used to reduce this loss. At this point, the lower plate of Cx 713 is still at ground and the PMOS 511 is still on and in a low resistance state. When the lower plate of Cx 713 is subsequently boosted by the mini-pump, Vinput is raised to Vinput=VDD+[VDD−Vth]*CapRatio if the VDD logic levels are used for G2 and G3. (As discussed with respect to FIG. 9, Vinput can be raised to a higher level if a higher logic level is used for G2 and G3.) This will turn off the PMOS 511, trigger the latch, and put PMOS 513 in a high resistance state. This results in OUTn_pr going low and the output at OUT going to the high VSUP level. If there is leakage from Vinput, the level on Vinput will subsequently discharge to some extent back toward VDD, but the latch will have already triggered and put the PMOS 513 into a high resistance state. Although PMOS 511 may no longer be fully off, NMOS 515 can still maintain the latch state since PMOS 513 is off, so the level shifter will operate properly. Later, when IN goes low, the diode connection will keep Vinput from returning to VSS, but taking RST low, RSTn will go high and the NMOS 711 will turn on and reset Vinput to ground.

Figure 12:
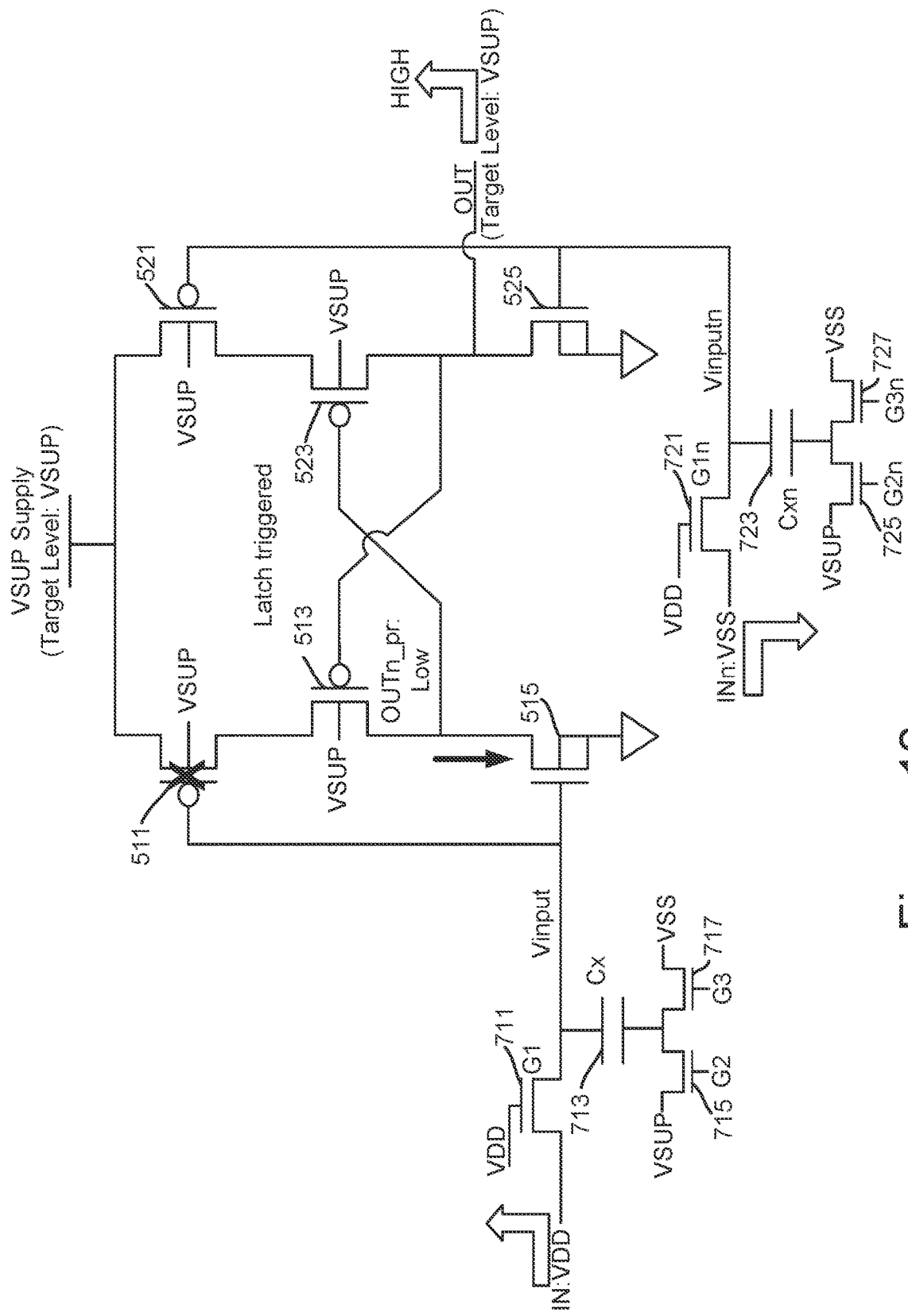
FIG. 12 presents a further embodiment of a mini-pump level shifter circuit.

FIG. 12 presents an alternate embodiment of a mini-pump level shifter circuit. The embodiment FIG. 12 repeats the elements of the embodiment of FIG. 11 and again uses a diode type connection for G1 711 and G1n 721, but now connects the control gates of these NMOSs to VDD. This allows the embodiment of FIG. 12 to again address leakage at Cx 713 and Cxn 723 and operate as described above with respect to FIG. 11. The connection of G1 711 and G1n 721 requires additional routing with respect to FIG. 10, but can eliminate the reset switches 711 and 773 of FIG. 10 as Vinput and Vinputn can be respectively reset though G1 711, G1n 721 when IN, INn is low. For example, FIG. 12 is again marked to show the case when IN goes high and INn goes low: since both G1 711 and G1n 721 are wired to VDD, they are both on. G1 711 passes the IN value of VDD to Vinput and Vinputn is pulled to VSS through G1n 721. The situation is reversed when IN goes low and INn goes high so that G1 711 and G1n 721 can provide the reset function for Vinput and Vinputn.

Figure 13:
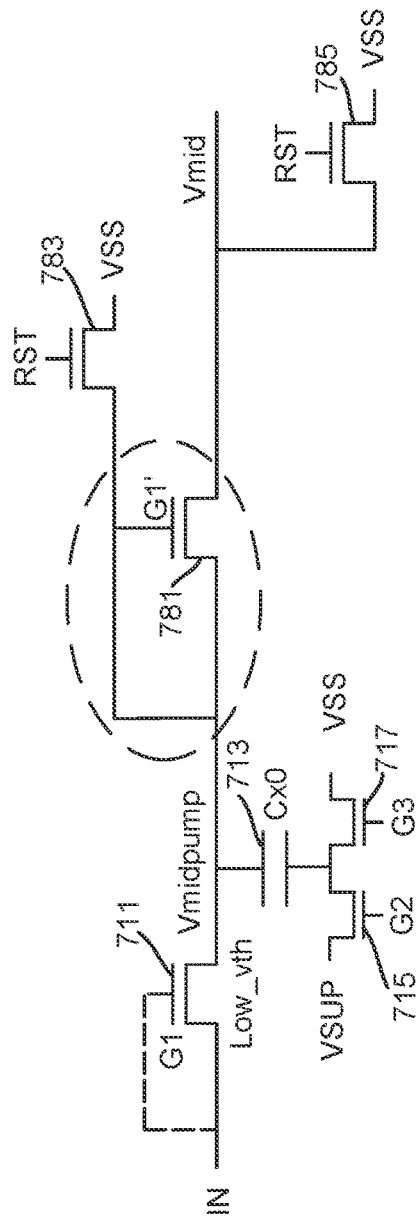
FIGS. 13 and 14 presents two additional embodiments for the charge pump structure of FIGS. 7, 10, and 12.
Figure 14:
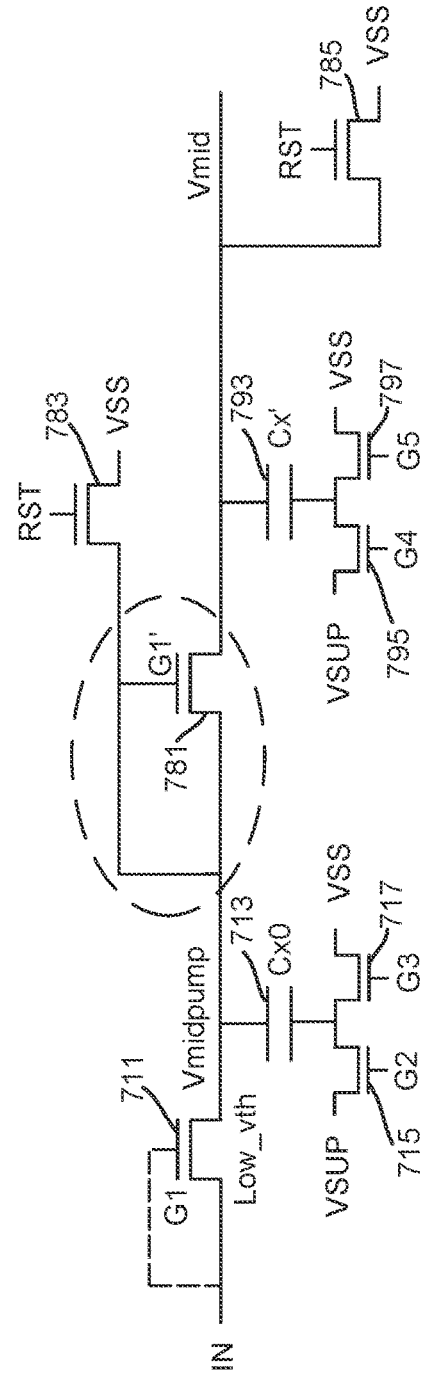

FIGS. 13 and 14 present two additional embodiments for the charge pump structure of FIG. 7, 10, or 12. Relative to these earlier figures, only the charge pump portion for the IN signal is shown, but where the INn charge pump can be similarly structured and the other parts of the level shifter circuit can be as before.

FIG. 13 includes G1 711, Cx0 713, G2 715, and G3 717 as in FIG. 7, 10, or 12, where G1 711 can be switched as in FIG. 7 or diode connected as in FIG. 10 or 12, as represented by the broken line to its control gate. Rather than the node at the upper plate of Cx0 713 being connected to PMOS 511 and NMOS 515 directly, the circled diode connected NMOS G1' 781 is now in the path. The pump can be based on the clock signal at logic level VDD for operating the switches G1 711 (if not diode connected), G2 715, and G3 715 as a Dickson pump with multiple pulse to boost the IN level. The capacitor 713 of the pump, now labeled Cx0, can be smaller, and the number of pulses depend on the ratio $C_{x0}/(C_n+C_p)$, where $C_{x0}$, $C_n$, and $C_p$ are respectively the capacitances of Cx0 713, NMOS 515, and PMOS 511. G1 711 can be a low Vth device and the diode G1' 781 can have a zero or small negative Vth. The voltage Vmidpump the upper plate of Cx0 713 is then passed by the diode G1' 781 to generate Vmid, that can then be applied to PMOS 511 and NMOS 515 and which has a final maximum voltage of 2VDD-Vth-Vtdiode, where Vth is again the threshold voltage of G2 715 and Vtdiode the threshold voltage of G1' 781. (The voltage level of Vmid=2VDD-Vth-Vtdiode is for VDD used as the logic level for the charge pump, but this level can raised further as described with respect to FIG. 9.) Additionally, to be able to reset the IN charge pump, a pair of NMOSs 783 and 785 can respectively set Vmidpump and Vmid to VSS in response to a reset signal.

All of the examples so far have been single stage charge pumps. If a higher output is desired, additional stages can be added. An example is illustrated with respect to FIG. 14. Relative to FIG. 13, the embodiment of FIG. 14 adds an additional pump stage of the same structure after G1' 781 to further boost Vmid by an additional VDD-Vth when the control signal used the VDD logic level. The node Vmid is connected to the top plate of the capacitor Cx' 793, whose bottom plate is connected to VSUP through G4 795 and to VSS though G5 797. This additional stage can add a final pulse to bring Vmid to a maximum level of 3VDD-2Vth- Vtdiode. If desired, higher levels can be obtained by additional stages of the Dickson type, by using high logic levels on the charge pump switches as described with respect to FIG. 9, or by a combination of these.

Figure 15:
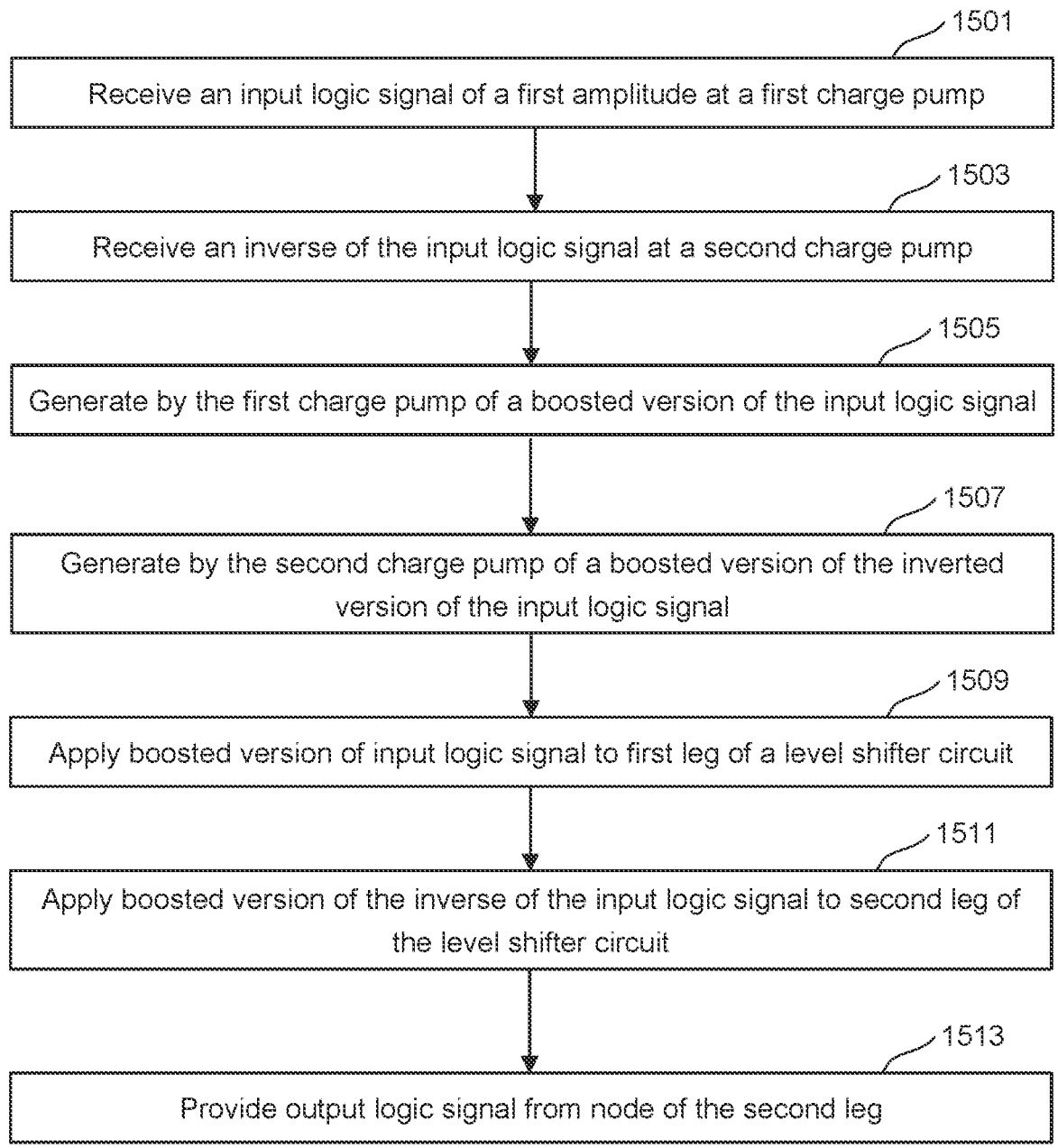
FIG. 15 is a flowchart of an embodiment for operation of a mini-pump level shifter.

FIG. 15 is a flowchart of an embodiment for operation of a mini-pump level shifter. The flow of FIG. 15 will primarily be described with reference to FIGS. 7 and 8, but readily extends to the additional embodiments and variations discussed with respect to FIGS. 9-14. At step 1501 the input logic signal IN of amplitude VDD, such as used in system control logic 360, is received at charge pump 710. Similarly, the inverse of the input logic signal INn is received at mini-pump 720 at step 1503. The charge pump 710 generates the boosted version of the input logic signal, namely Vinput, at step 1505 and the charge pump 720 generates the boosted version of the inverse of the input logic signal, namely Vinputn, at step 1507. The charge pumps 710 and 720 can be operated based on the control signals of FIG. 8 that can be generated by one or more of control circuits of power control 364 and other elements of the system control logic 360. The signals Vinput and Vinputn are respectively applied to the PMOS and NMOS of the right and left legs of the level shifter circuit at steps 1509 and 1511. In response, the output logic signal with an amplitude of VSUP or other raised level is then provided from the OUT node at step 1513.

Although FIG. 15 was described with respect to FIGS. 7 and 8, it readily extends to the other embodiments as described above. For any of these embodiments, the described use of a mini-pump level shifter can provided guaranteed operation as VDD level decrease relative to VSUP. This can be accomplished with a reduced gate area that increases as the VDD-VSUP gap increases. Additionally, although the mini-pump level shifter circuit embodiments are presented here in the context of non-volatile memory die, they can similarly be applied to other devices that need to shift from one logic level to another, higher logic level.

In a first set of aspects, an apparatus includes a control circuit configured to connect to an array of non-volatile memory cells and comprising a level shifter circuit configured to generate an output logic signal from an input logic signal. A high level of the output logic signal being higher than a high level of the input logic signal. The level shifter circuit comprises a first leg and a second leg connected in parallel between a supply level and ground, the supply level having a higher voltage level than the high level of the input logic signal. The first leg includes: a first latch transistor connected between the supply level and ground and having a gate connected to the second leg; a first PMOS through which the first latch transistor is connected to the supply level; and a first NMOS through which the first latch transistor is connected to ground. The second leg includes: a second latch transistor connected between the supply level and ground and having a gate connected to the first leg; a second PMOS through which the second latch transistor is connected to the supply level; and a second NMOS through which the second latch transistor is connected to ground, the output logic signal provided from a node between the second NMOS and the second latch transistor. The level shifter circuit also includes: a first charge pump configured to receive the input logic signal and provide a boosted version of the input logic signal to a gate of the first PMOS and a gate of the first NMOS; and a second charge pump configured to receive an inverse of the input logic signal and provide a boosted version of the inverse of the input logic signal to a gate of the second PMOS and a gate of the second NMOS.

In other aspects, a method comprises: receiving an input logic signal of a first amplitude at a first charge pump; receiving an inverted version of the input logic signal at a second charge pump; generating by the first charge pump of a boosted version of the input logic signal; generating by the second charge pump of a boosted version of the inverted version of the input logic signal; applying the boosted version of the input logic signal to a gate of a PMOS and an NMOS of a first leg of a level shifter circuit including a latch transistor connected to a supply level through the first leg's PMOS and to ground through the first leg's NMOS; applying the boosted version of the inverse of the input logic signal to the gate of a PMOS and an NMOS of a second leg of a level shifter circuit including a latch transistor connected to the supply level through the second leg's PMOS and to ground through the second leg's NMOS, a gate of the second leg's latch transistor connected to the first leg and a gate of the first leg's latch transistor connected to second leg; and providing an output logic signal of a second amplitude from a node between the latch transistor and the NMOS of the second leg, the second amplitude being greater than the first amplitude.

In additional aspects, a level shifter circuit includes a first leg connected between a supply level and ground, including: a first latch transistor connected between the supply level and ground; a first PMOS through which the first latch transistor is connected to the supply level; and a first NMOS through which the first latch transistor is connected to ground. A second leg is connected in parallel with the first leg between the supply level and ground, a gate of the first latch transistor connected to the second leg, the second leg including: a second latch transistor connected between the supply level and ground and having a gate connected to the first leg; a second PMOS through which the second latch transistor is connected to the supply level; and a second NMOS through which the second latch transistor is connected to ground. A first charge pump is connected to receive an input logic signal and provide a boosted version of the input logic signal to a gate of the first PMOS and a gate of the first NMOS. A second charge pump is connected to receive an inverse of the input logic signal and provide a boosted version of the inverse of the input logic signal to a gate of the second PMOS and a gate of the second NMOS. One or more control circuits is connected to the first charge pump and the second charge pump to generate the boosted version of the input logic signal and the boosted version of the inverse of the input logic signal to generate an output logic signal at a node between the second NMOS and the second latch transistor, a high level of the output logic signal being higher than a high level of the input logic signal.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a control circuit configured to connect to an array of non-volatile memory cells and comprising a level shifter circuit configured to generate an output logic signal from an input logic signal, a high level of the output logic signal being higher than a high level of the input logic signal, the level shifter circuit comprising:
a first leg and a second leg connected in parallel between a supply level and ground, the supply level having a higher voltage level than the high level of the input logic signal, each leg including:
a latch transistor connected between the supply level and the ground and having a gate connected to the other of the first and second legs;
a PMOS transistor through which the latch transistor is connected to the supply level; and
an NMOS transistor through which the latch transistor is connected to the ground, wherein the output logic signal is provided from a node between the NMOS transistor and the latch transistor of the second leg, and
a first charge pump and a second charge pump respectively corresponding to the first leg and the second leg and respectively configured to receive the input logic signal and an inverse of the input logic signal and provide a boosted version of the input logic signal and the inverse of the input logic signal to a gate of the corresponding PMOS transistor and a gate of the corresponding NMOS transistor, each of the first and second charge pump comprising:
a pump capacitor having a first plate connected to the gate of the PMOS transistor of the corresponding leg and the gate of the gate NMOS transistor of the corresponding leg;
a first pump NMOS transistor connected between an input for the corresponding one of the input logic signal and the inverse of the input logic signal and the first plate of the pump capacitor;
a second pump NMOS transistor connected between the supply level and a second plate of the pump capacitor; and
a third pump NMOS transistor connected between the ground and the second plate of the pump capacitor.

2. The apparatus of claim 1, wherein the control circuit is formed on a control die, the apparatus further comprising:
a memory die including the array of memory cells, the memory die separate from and bonded to the control die.

3. The apparatus of claim 1, wherein for each of the legs:
the latch transistor is a PMOS transistor and the gate of the latch transistor is connected to the other of the first and second legs between the latch transistor and the NMOS transistor of the other of the first and second legs.

4. The apparatus of claim 1, wherein the high logic level of the output logic signal is the supply level.

5. The apparatus of claim 1, wherein, for each of the first and second charge pump, the first pump NMOS transistor is switched in response to control signals generated by the control circuit.

6. The apparatus of claim 1, wherein, for each of the first and second charge pump, the first pump NMOS transistor is diode connected.

7. The apparatus of claim 6, wherein the level shifter circuit further comprises:
for each of the first and second charge pump, a reset switch connected between the first plate of the pump capacitor and the ground.

8. The apparatus of claim 1, wherein, for each of the first and second charge pump, a gate of the first pump NMOS transistor is connected to the high level of the input logic signal.

9. The apparatus of claim 1, wherein, for each of the first and second charge pump, the charge pump further comprises a pump diode connected between the first plate of the pump capacitor and the gate of each of the PMOS transistor and the NMOS transistor.

10. The apparatus of claim 9, wherein, for each of the first and second charge pump, the charge pump further comprises an additional pump stage including a capacitor connected to the gate of each of the PMOS transistor and the NMOS transistor.

11. The apparatus of claim 1, wherein the control circuit is further configured to generate a plurality of control signals for a corresponding plurality of the NMOS pump transistors, the control signals having an amplitude of the supply level.

12. The apparatus of claim 1, wherein the control circuit is further configured to generate a plurality of control signals for a corresponding plurality of the NMOS pump transistors, the control signals having an amplitude of the high level of the input logic signal.

13. The apparatus of claim 1, wherein the control circuit is further configured to generate a plurality of control signals for a corresponding plurality of the NMOS pump transistors, the control signals having an amplitude intermediate to the supply level and the high level of the input logic signal.

14. The apparatus of claim 1, wherein the control circuit includes system control logic circuitry having logic circuitry that operates using the high level of the input logic signal, and decoding circuitry for the array of non-volatile memory cells having logic circuitry that operates using the high level of the output logic signal.

15. The apparatus of claim 1, the level shifter circuit further comprising:
a first enable switch through which the first leg and second leg are connected to the supply level; and
a second enable switch through which the node between the NMOS transistor and the latch transistor of the second leg is connected to the ground.

* * * * *